United States Patent
Moon et al.

(10) Patent No.: US 8,213,248 B2
(45) Date of Patent: Jul. 3, 2012

(54) SEMICONDUCTOR MEMORY DEVICE HAVING IMPROVED LOCAL INPUT/OUTPUT LINE PRECHARGE SCHEME

(75) Inventors: Jong-Ho Moon, Suwon-si (KR);
Seong-Jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 303 days.

(21) Appl. No.: 12/659,328

(22) Filed: Mar. 4, 2010

(65) Prior Publication Data
US 2010/0226192 A1    Sep. 9, 2010

(30) Foreign Application Priority Data
Mar. 6, 2009   (KR) .................. 10-2009-0019324

(51) Int. Cl.
*G11C 7/00* (2006.01)

(52) U.S. Cl. ................ 365/203; 365/205; 365/230.06

(58) Field of Classification Search .......... 365/63, 365/189.05, 203, 205, 222, 230.06
See application file for complete search history.

(56) References Cited

U.S. PATENT DOCUMENTS

| | | | |
|---|---|---|---|
| 6,545,922 B2 | 4/2003 | Nakazawa | |
| 6,930,939 B2 | 8/2005 | Lim et al. | |
| 7,139,208 B2 * | 11/2006 | Arimoto et al. | 365/222 |
| 7,855,926 B2 * | 12/2010 | Shin et al. | 365/190 |
| 2003/0016551 A1 * | 1/2003 | Takemura et al. | 365/63 |
| 2003/0137863 A1 * | 7/2003 | Takemura et al. | 365/63 |
| 2006/0013030 A1 * | 1/2006 | Arimoto et al. | 365/63 |
| 2007/0280008 A1 | 12/2007 | Byeon | |

FOREIGN PATENT DOCUMENTS

| | | |
|---|---|---|
| JP | 2001-184866 A | 7/2001 |
| KR | 10-2004-0038449 A | 5/2004 |
| KR | 10-0762905 B1 | 9/2007 |
| KR | 10-2007-0115140 A | 12/2007 |

* cited by examiner

*Primary Examiner* — Gene Auduong
(74) *Attorney, Agent, or Firm* — Lee & Morse, P.C.

(57) ABSTRACT

A data path circuit of a semiconductor memory device includes: a bit line sense amplifier driven by a first power supply voltage; a local input/output line sense amplifier; a column selecting unit operatively connecting a pair of bit lines connected to the bit line sense amplifier and a pair of local input/output lines connected to the local input/output line sense amplifier in response to a column selection signal; and a local input/output line precharge unit precharging the pair of local input/output lines with a second power supply voltage different from the first power supply voltage during a period for which the column selection signal is in an inactive state.

14 Claims, 3 Drawing Sheets

SEMICONDUCTOR MEMORY DEVICE HAVING IMPROVED LOCAL INPUT/OUTPUT LINE PRECHARGE SCHEME

BACKGROUND

1. Field

Embodiments relate to a semiconductor memory device. More particularly, embodiments relate to a data path circuit of a semiconductor memory device, such as a dynamic random access memory.

2. Description of the Related Art

In recent years, the processing speed and the degree of integration of semiconductor memory devices, such as dynamic random access memories, have been increased to meet user demands. A dynamic random access memory (DRAM) device including one access transistor and one storage capacitor as a unit memory cell is generally used as a main memory of an electronic system.

During the read operation of a DRAM, a bit line sense amplifier may sense and amplify data stored in the memory cells on a pair of bit lines. Then, when a column selection line (hereinafter, referred to as a CSL) signal is activated, the amplified data may be transmitted to a pair of local input/output lines. The data transmitted to the pair of local input/output lines may be transmitted to a data output buffer through a pair of global input/output lines and may then be read to the outside.

In memory devices, e.g., DRAM devices, when lines, e.g., bit lines or local input/output lines, are not active, they are generally precharged to a level to prevent floating and to increase sensing speed. In a general DRAM, e.g., the precharge level of the pair of local input/output lines may be equal to a level of the bit line sensing voltage. The bit line sensing voltage is generally the internal power supply voltage of the memory cell array, and the pair of local input/output lines is precharged with the internal power supply voltage. Then, when local line sensing is performed, only one of the pair of local input/output lines may be pulled down to a ground voltage GND unlike a bit line sensing scheme in which the pair of local input/output lines is precharged with a half power supply voltage and is pulled up or pulled down to VDD or GND. Therefore, in the local line sensing scheme, when the optimal voltage level is not used, the amount of current consumed by the local input/output line sense amplifier may be unnecessarily increased, as compared to the bit line sensing scheme. Such unnecessarily higher power consumption reduces performance, e.g., when the DRAM is used for portable electronic devices performance of such portable electronic devices may be reduced.

Typically, when a precharge level for a pair of local input/output lines is not optimized, bit line disturbance is more likely to occur when a pair of bit lines is active. In such cases, charge may be transmitted from the local input/output line to the bit line, which may result in bit line disturbance. As a result, data stored in the memory cell may be reversed.

Therefore, a technique is required which can reduce, minimize, and/or eliminate bit line disturbance, reduce power consumption, and achieve a low-voltage and high-speed operation in a data path circuit of a DRAM that transmits data read from memory cells to an output buffer.

SUMMARY

Embodiments are therefore directed to semiconductor memory devices, which substantially overcome one or more of the problems due to the limitations and disadvantages of the related art.

It is therefore a feature of an embodiment to provide a data path circuit of a semiconductor memory device capable of minimizing and/or preventing bit line disturbance.

It is therefore a separate feature of an embodiment to provide a local input/output line precharge scheme capable of minimizing and/or preventing bit line disturbance and achieving a low-voltage and high-speed operation.

It is therefore a separate feature of an embodiment to provide a semiconductor memory device capable of reducing power consumption during a sensing operation of a local input/output line sense amplifier.

It is therefore a separate feature of an embodiment to provide a semiconductor memory device capable of reducing power consumption during a local input/output line precharge operation.

It is therefore a separate feature of an embodiment to minimize and/or prevent bit line disturbance, reduce the power consumed by the local input/output sense amplifier, and achieve a low-voltage and high-speed operation in a memory device.

At least one of the above and other features and advantages may be realized by providing a data path circuit of a semiconductor memory device, the data path circuit including a bit line sense amplifier adapted to be driven by a first power supply voltage, a local input/output line sense amplifier, a column selecting unit adapted to operatively connect a pair of bit lines connected to the bit line sense amplifier and a pair of local input/output lines connected to the local input/output line sense amplifier in response to a column selection signal, and a local input/output line precharge unit adapted to precharge the pair of local input/output lines with a second power supply voltage different from the first power supply voltage during a period for which the column selection signal is in an inactive state.

The local input/output line precharge unit may include three PMOS transistors.

The second power supply voltage may be lower than the first power supply voltage.

The level of a bias current of the local input/output line sense amplifier may be adjusted by the second power supply voltage.

The local input/output line precharge unit may be adapted to precharge the pair of local input/output lines with the second power supply voltage different from the first power supply voltage only during a period for which the column selection signal is in an inactive state operatively blocking the connection between the pair of bit lines and the pair of local input/output lines.

At least one of the above and other features and advantages may be realized by separately providing a semiconductor memory device, including a memory cell array including a plurality of memory cells, each having one access transistor and one storage capacitor, arranged in a matrix, a bit line sense amplifier connected to a pair of bit lines connected to the memory cells and adapted to be driven by a first power supply voltage, a local input/output line sense amplifier connected between a pair of global input/output lines and a pair of local input/output lines, a column selecting unit adapted to operatively connect the pair of bit lines and the pair of local input/output lines in response to a column selection signal, and a local input/output line precharge unit adapted to precharge the pair of local input/output lines with a second power supply voltage different from the first power supply voltage during a period for which the column selection signal is in an inactive state.

The local input/output line precharge unit may include first conduction-type MOS transistors.

The column selecting unit may include second conduction-type MOS transistors, the first conduction-type being different from the second conduction-type.

The device may include a half power supply voltage precharging and equalizing unit precharging the pair of local input/output lines with a half power supply voltage before a word line is activated.

The first power supply voltage may be an array internal power supply voltage, and the second power supply voltage is lower than the first power supply voltage.

The level of a bias current of the local input/output line sense amplifier may be adjusted by the second power supply voltage.

The local input/output line precharge unit may be adapted to precharge the pair of local input/output lines with the second power supply voltage different from the first power supply voltage only during a period which the column selection signal is in an inactive state operatively blocking the connection between the pair of bit lines and the pair of local input/output lines.

At least one of the above and other features and advantages may be realized by providing a dynamic random access memory, including a memory cell array including a plurality of memory cells, each including one access transistor and one storage capacitor, arranged in a matrix, a bit line sense amplifier connected to a pair of bit lines connected to the memory cells and adapted to be driven by a first power supply voltage, a local input/output line sense amplifier connected between a pair of global input/output lines and a pair of local input/output lines and having a bias current that is adjusted by a second power supply voltage lower than the first power supply voltage, a column selecting unit adapted to operatively connect the pair of bit lines and the pair of local input/output lines in response to a column selection signal, a local input/output line precharge unit adapted to precharge the pair of local input/output lines with the second power supply voltage during a period for which the column selection signal is in an inactive state, a signal generating unit adapted to receive signals related to read/write commands and to generate a period pulse signal for setting a detection operation period, a level detecting unit adapted to be enabled in response to the period pulse signal, to compare a reference signal with the second power supply voltage that is fed back, and to output a driving enable signal, and a voltage driver adapted to generate the second power supply voltage in response to the driving enable signal and to apply the second power supply voltage to the local input/output line precharge unit and the local input/output line sense amplifier.

The local input/output line precharge unit may be adapted to precharge the pair of local input/output lines with the second power supply voltage only during a period which the column selection signal is in an inactive state operatively blocking the connection between the pair of bit lines and the pair of local input/output lines.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
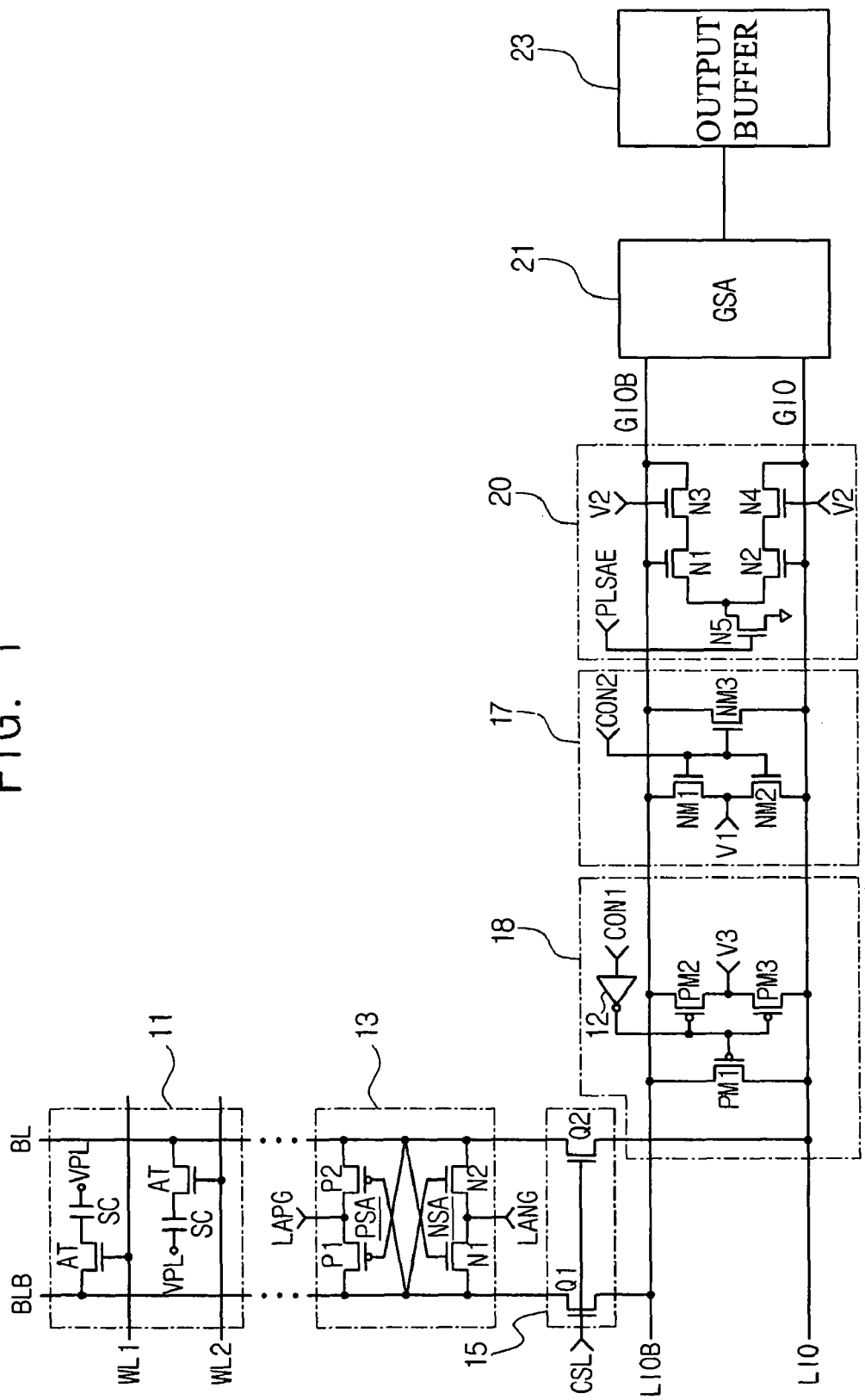
FIG. 1 illustrates a schematic diagram of an exemplary embodiment of a data path circuit including a local input/output line precharge scheme.

Korean Patent Application No. 10-2009-0019324, filed on Mar. 6, 2009, in the Korean Intellectual Property Office, and entitled: "Semiconductor Memory Device Having Improved Local Input/Output Line Precharge Scheme," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. More particularly, exemplary embodiments of semiconductor memory devices capable of minimizing or preventing bit line disturbance, reducing power consumption, and/or achieving a low-voltage and high-speed operation according will be described with reference to the accompanying drawings. It will be understood that when an element is referred to as being "between" two elements, it can be the only element between the two elements, or one or more intervening elements may also be present. It will also be understood that when an element is referred to as being "connected" to another element, it can be directly connected to the other element or one or more intervening elements may also be present. Like reference numerals refer to like elements throughout the specification.

FIG. 1 illustrates a schematic diagram of an exemplary embodiment of a data path circuit including a local input/output line precharge scheme.

Referring to FIG. 1, a data path circuit of, e.g., a DRAM, may include a memory cell array 11, a bit line sense amplifier 13, a column selecting unit 15, a local input/output line precharge unit 18, a half power supply voltage precharging and equalizing unit 17, a local input/output line sense amplifier 20, a global input/output line sense amplifier 21, and an output buffer 23.

In the memory cell array 11, each memory cell may include one access transistor AT and one storage capacitor SC. Word lines WL1 and WL2 may be connected to gates of the access transistors AT in the memory cells. A bit line pair including a bit line BL and a complementary bit line BLB may be connected to the drain and source of the access transistors AT. The bit line sense amplifier 13 may be connected to the bit line pair BL and BLB. During a read operation, data stored in the memory cell selected from the memory cell array 11 may appear as a potential difference between the pair of bit lines BL and BLB, and the bit line sense amplifier 13 may sense and amplify the potential difference.

The column selecting unit 15 may operatively connect the pair of bit lines BL and BLB and a pair of local input and output lines LIO and LIOB connected to the local input/output line sense amplifier 20 in response to a column selection signal CSL. During a read operation, the data sensed and amplified by the bit line sense amplifier 13 may be transmitted from the pair of bit lines BL and BLB to the pair of local input and output lines LIO and LIOB.

Referring to FIG. 1, before a read or write operation is performed on the selected memory cell and the respective word line WL is activated, the half power supply voltage precharging and equalizing unit 17 may precharge the pair of local input and output lines LIO and LIOB with a half power supply voltage level VBL. Therefore, a high-level control signal CON2 may be applied to the respective word line WL in an inactive state, and a voltage V1 with a half power supply voltage level (½VINTA, VBL) may be applied to a common drain connection node of NMOS transistors NM1 and NM2.

In the local input/output line precharge unit 18, the pair of local input/output lines LIO and LIOB may be precharged by the PMOS transistors PM2 and PM3 and may be equalized by the PMOS transistor PM1 in response to an active command during a period which a column selection signal CSL is deactivated. More particularly, when the column selection line is in an inactive state and the respective word line WL is in an active state (active mode), an inverter 12 provided in the local input/output line precharge unit 18 may invert a control signal CON1 that may be applied at a high level.

It is noted that a precharge voltage V3 applied to the PMOS transistors PM2 and PM3 is lower than an array internal power supply voltage VINT. In this description, the array internal power supply voltage VINT may also be referred to as a first power supply voltage, and the precharge voltage V3 may also be referred to as a second power supply voltage VINTLP. It is also noted that a voltage V1 applied to a common drain connection node of NMOS transistors NM1 and NM2 of the half power supply voltage precharging and equalizing unit 17 may have a half power supply voltage level ½(VINTA), (VBL).

The local input/output line sense amplifier 20 may include NMOS transistors N1, N2, N3, N4, and N5. A signal PLSAE applied to the NMOS transistor N5 may be a sense amplifier enable signal capable of adjusting a bias current. The local input/output line sense amplifier 20 may be activated according to a level of the enable signal PLSAE and may discharge one of a pair of local input/output lines LIO and LIOB having a lower potential to the ground. Then, data that is locally sensed on the pair of local input/output lines LIO and LIOB may be transmitted to a pair of global input/output lines GIO and GIOB.

In FIG. 1, the level of a voltage LAPG applied to the bit line sense amplifier 13 may be equal to that of the first power supply voltage, i.e., the array internal power supply voltage VINT, and the level of a voltage V2 that may be applied to gates of the NMOS transistors N3 and N4 of the local input/output line sense amplifier 20 may be equal to that of the first power supply voltage, i.e., the array internal power supply voltage VINT.

The level of a voltage V3 applied to a common drain connection node of the local input/output line precharge unit 18 and the level of the signal PLSAE applied to the gate of the NMOS transistor N5 of the local input/output line sense amplifier 20 may be equal to that of the second power supply voltage VINTLP, which is lower than the first power supply voltage VINT. In embodiments, the first power supply voltage VINT may be equal to and/or in the range of about 1.2 V to about 1.5 V, and the second power supply voltage VINTLP may be equal to and/or in the range of about 0.8 V to about 0.9 V.

Further, referring to FIG. 1, during a read operation, the local input/output line sense amplifier 20 may sense the data of the selected memory cell transmitted to the pair of local input/output lines LIO and LIOB, and may output the sensed data to the global input/output lines GIO and GIOB.

Referring still to FIG. 1, a level of the signal PLSAE applied to the NMOS transistor N5 of the local input/output line sense amplifier 20 may be equal to that of the second power supply voltage VINTLP, and it may be adjusted. The bias current of the local input/output line sense amplifier 20 may be adjusted according to the level of the voltage applied to the gate of the NMOS transistor N5.

The global input/output line sense amplifier 21 may sense and amplify the data of the selected memory cell transmitted to the global input/output lines GIO and GIOB, and may output the amplified data to the output buffer 23.

In embodiments, an operation of precharging the pair of local input/output lines LIO and LIOB may be performed until the respective word line WL is disabled, i.e., the active mode (ACT) is disabled.

Figure 2:
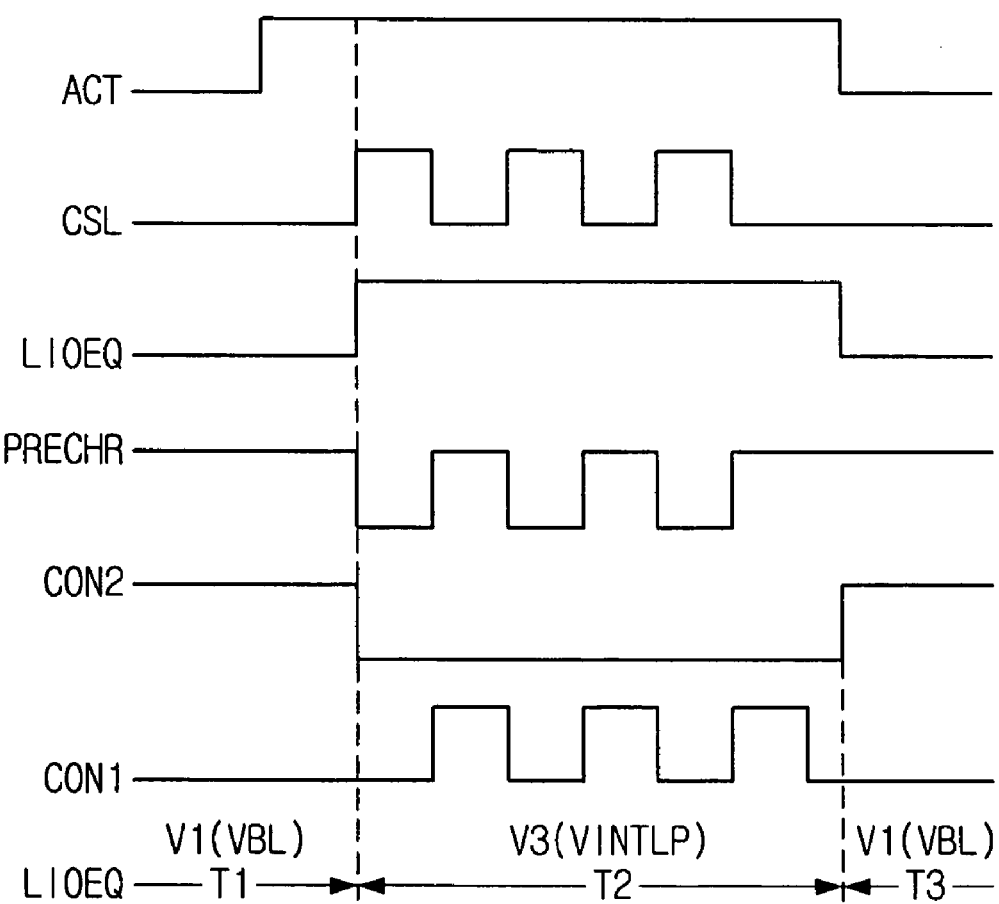
FIG. 2 illustrates a timing diagram of exemplary signals employable by for operating the data path circuit of FIG. 1.

FIG. 2 illustrates a timing diagram of exemplary signals employable by for operating the data path circuit of FIG. 1.

Referring to FIG. 2, during a first period T1, the control signal CON2 may be at a high level and the control signal CON1 may be at a low level. The column selection signal CSL may be maintained in an inactive state. During this time, the half power supply voltage precharging and equalizing unit 17 may precharge the pair of local input/output lines LIO and LIOB with the half power supply voltage VBL. During an active mode (ACT), e.g., a second period T2, the respective word line WL connected to the selected memory cell may be enabled in order read data from the selected memory cell. An equalization signal generating unit may generate a window signal LIOEQ having an enable period (a period T2 of FIG. 2) from an enable start time of the column selection signal CSL to the active (ACT) mode end time. More particularly, referring to FIG. 2, after the active (ACT) mode changes to a high level, the level of the column selection signal CSL may periodically change between a high level and a low level, the control signal CON2 may be at a low level, and the control signal CON1 may have a level and/or waveform opposite to that of the column selection signal CSL.

More particularly, referring to FIGS. 1 and 2, as discussed above, before a read or write operation is performed on the selected memory cell and the respective word line is activated, e.g., during period T1, the half power supply voltage precharging and equalizing unit 17 may precharge the pair of local input/output lines LIO and LIOB with the half power supply voltage VBL. Thus, during a period T1 or T3 when the word line is in an inactive state, a high-level control signal CON2 may be applied. The voltage V1 applied to a common drain connection node of the NMOS transistors NM1 and NM2 may be half power supply voltage level ½(VINTA), (VBL). The VBL precharge operation may be performed during the periods T1 and T3 shown in FIG. 2.

During the period T2, the local input/output line precharge unit 18 may precharge the pair of local input/output lines LIO and LIOB with the second power supply voltage VINTLP that is lower than the cell array operation voltage VINTA when the column selection signal CSL is in an inactive state. That is, e.g., the voltage V3 applied to the common source connection node of the PMOS transistors PM1 and PM2 is lower than the cell array operation voltage VINTA, and the pair of local input/output lines LIO and LIOB may be precharged with the second power supply voltage VINTLP. The control signal CON1 may be at a high level during the period for which the column selection signal CSL is in the inactive state. As shown in FIG. 1, the control signal CON1 may be inverted by the inverter 12 shown in FIG. 1. Thus, while the column selection signal CSL is in the inactive state, the control signal CON1 may be at a high level such that PMOS transistors PM1, PM2, and PM3 may be turned on for precharge and equalization as a result of the inverter 12. More particularly, e.g., with regard to the local input/output line precharge unit 18, while the column selection signal CSL is active, e.g., high to turn on the column selection transistors Q1, Q2, the control signal CON1 may have a value so as to disable precharging of the pair of local input/output lines LIO and LIOB by turning off the transistors PM1, PM2, PM3.

Further, referring to FIG. 1, during a read operation, the local input/output line sense amplifier 20 may sense the data of the selected memory cell transmitted to the pair of local input/output lines LIO and LIOB, and may output the sensed data to the global input/output lines GIO and GIOB.

The level of the signal PLSAE applied to the NMOS transistor N5 of the local input/output line sense amplifier 20 may be equal to that of the second power supply voltage VINTLP, and it may be adjusted. The bias current of the local input/output line sense amplifier 20 may be adjusted according to the level of the voltage applied to the gate of the NMOS transistor N5.

The global input/output line sense amplifier 21 may sense and amplify the data of the selected memory cell transmitted to the global input/output lines GIO and GIOB, and may output the amplified data to the output buffer 23.

In embodiments, the operation of precharging the pair of local input/output lines LIO and LIOB may be performed until the respective word line WL is disabled and the active mode (ACT) is disabled. However, in embodiments, while data is transmitted from the pair of bit lines BL and BLB to the local input/output lines LIO and LIOB, the precharge operation for the pair of local input/output lines LIO and LIOB may be stopped. More particularly, e.g., during the period for which a column address strobe (CAS) signal is applied, the column selection signal CSL is enabled, and the column selection transistors Q1 and Q2 connecting the pair of bit lines BL and BLB and the pair of local input/output lines LIO and LIOB are turned on, the precharge operation for the pair of local input/output lines LIO and LIOB is not performed. In such cases, e.g., as shown in FIG. 2, when a voltage corresponding to data is applied to the pair of local input/output lines (e.g., column selection signal is at a high level), the precharge enable signal is disabled (e.g., PRECHR is at a high level). Then, when the active mode (ACT) ends, the period T3 starts and the pair of local input/output lines LIO and LIOB may be again precharged with the bit line voltage VBL.

Since the local input/output line precharge unit 18 shown in FIG. 1 may precharge the PMOS transistors under a long tRCD condition, embodiments may be robust against the bit line disturbance. In embodiments, the memory device may further include a sub precharge unit (not shown) that precharges the NMOS transistor under a short tRCD condition in order to improve a low-voltage and high-speed operation.

As discussed above, by employing a precharge level or setting a sensing start level of the local input/output line to be lower than that of the internal power supply voltage, embodiments may enable the bit line disturbance and a sensing current to be reduced.

Figure 3:
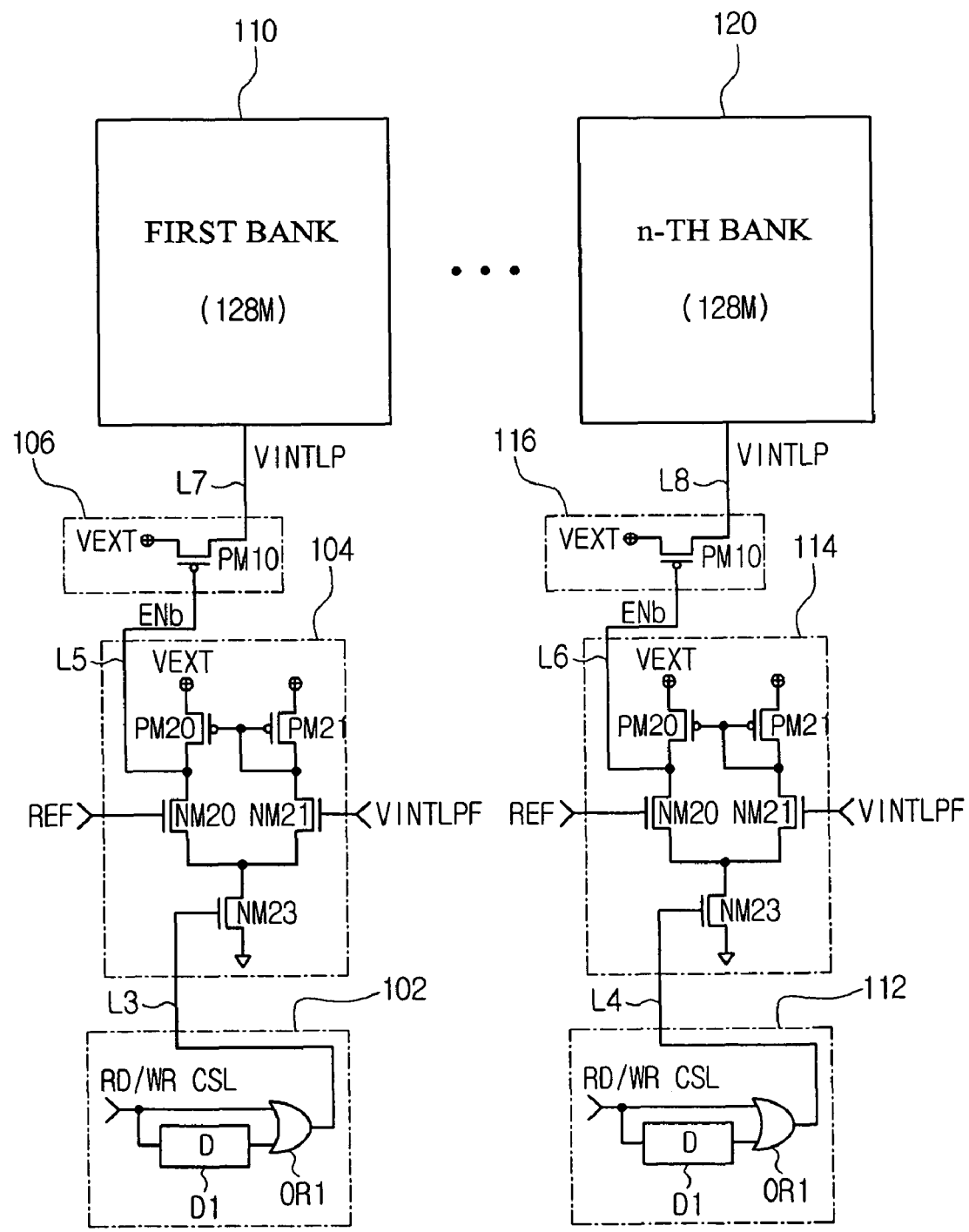
FIG. 3 illustrates a schematic diagram of an exemplary voltage supply scheme of the data path circuit of FIG. 1.

FIG. 3 illustrates a schematic diagram of an exemplary voltage supply scheme of the data path circuit of FIG. 1. In FIG. 3, first to n-th banks 110 to 120 form the memory cell array 11 shown in FIG. 1.

The level of the voltage V3 applied to the common drain connection node of the local input/output line precharge unit 18 shown in FIG. 1 and the level of the signal PLSAE applied to the gate of the NMOS transistor N5 of the local input/output line sense amplifier 20 may be equal to that of the second power supply voltage VINTLP applied through supply lines L7 and L8 shown in FIG. 3.

The second power supply voltage VINTLP may be generated by voltage drivers 106 and 116. Each of the voltage drivers may include a PMOS transistor PM10. Each of the voltage drivers 106 and 116 may be allocated to the banks 110 to 120 and may generate the second power supply voltage VINTLP in response to a driving enable signal ENb and may apply the generated voltage to the local input/output line precharge unit 18 and the local input/output line sense amplifier 20.

As shown in FIG. 3, signal generating units 102 and 112 and level detecting units 104 and 114 may be provided in order to apply the second power supply voltage VINTLP at an accurate level only when an event is generated.

Each of the signal generating units 102 and 112 may include a delay D1 that delays a read/write column selection signal for each of the bank 110 to 120, and an OR gate OR1 that receives the output of the delay D1 and the column selection signal and outputs an OR response. Each of the signal generating units 102 and 112 may receive a signal RD/WR CSL related to read/write commands and may generate a period pulse signal for setting a detection operation period.

Each of the level detecting units 104 and 114 may be enabled in response to the period pulse signal, may compare a reference signal REF with the second power supply voltage VINTLPF that is fed back, and may output the driving enable signal ENb. Each of the level detecting units 104 and 114 may include PMOS and NMOS transistors PM20, PM21, NM20, NM21, and NM23. Each of the level detecting units 104, 114 may be a current mirror type amplifier.

In the structure shown in FIG. 3, the signal CSL may be used to generate an auto-pulse during the read/write operation for each bank 110 . . . 120, and the second power supply voltage may be performed during the period for which the auto-pulse is generated. Therefore, it is possible to improve, e.g., optimize, power consumption. In addition, it is possible to supply the optimal power by flexibly adjusting the time of the auto-pulse.

According to the above-mentioned embodiment of the invention, it is possible to minimize and/or prevent bit line disturbance, reduce the power consumed by the local input/output sense amplifier, and/or improve a low-voltage and high-speed operation.

In the above-described embodiment, the DRAM is used as an example of the memory device. However, the technical scope and spirit of the invention can be applied to other volatile memories, such as a pseudo SRAM.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, the detailed connection structure of the local input/output line precharger may be changed or the method of applying a voltage may be changed.

What is claimed is:

1. A data path circuit of a semiconductor memory device, the data path circuit comprising:
    a bit line sense amplifier adapted to be driven by a first power supply voltage;
    a local input/output line sense amplifier;
    a column selecting unit adapted to operatively connect a pair of bit lines connected to the bit line sense amplifier and a pair of local input/output lines connected to the local input/output line sense amplifier in response to a column selection signal; and
    a local input/output line precharge unit adapted to precharge the pair of local input/output lines with a second power supply voltage different from the first power supply voltage during a period for which the column selection signal is in an inactive state.

2. The data path circuit as claimed in claim 1, wherein the local input/output line precharge unit includes three PMOS transistors.

3. The data path circuit as claimed in claim 2, wherein the second power supply voltage is lower than the first power supply voltage.

4. The data path circuit as claimed in claim 3, wherein the level of a bias current of the local input/output line sense amplifier is adjusted by the second power supply voltage.

5. The data path circuit as claimed in claim 1, wherein the local input/output line precharge unit is adapted to precharge the pair of local input/output lines with the second power supply voltage different from the first power supply voltage only during a period for which the column selection signal is in an inactive state operatively blocking the connection between the pair of bit lines and the pair of local input/output lines.

6. A semiconductor memory device, comprising:
   a memory cell array including a plurality of memory cells, each having one access transistor and one storage capacitor, arranged in a matrix;
   a bit line sense amplifier connected to a pair of bit lines connected to the memory cells and adapted to be driven by a first power supply voltage;
   a local input/output line sense amplifier connected between a pair of global input/output lines and a pair of local input/output lines;
   a column selecting unit adapted to operatively connect the pair of bit lines and the pair of local input/output lines in response to a column selection signal; and
   a local input/output line precharge unit adapted to precharge the pair of local input/output lines with a second power supply voltage different from the first power supply voltage during a period for which the column selection signal is in an inactive state.

7. The semiconductor memory device as claimed in claim 6, wherein the local input/output line precharge unit includes first conduction-type MOS transistors.

8. The semiconductor memory device as claimed in claim 7, wherein the column selecting unit includes second conduction-type MOS transistors, the first conduction-type being different from the second conduction-type.

9. The semiconductor memory device as claimed in claim 6, further comprising:
   a half power supply voltage precharging and equalizing unit precharging the pair of local input/output lines with a half power supply voltage before a word line is activated.

10. The semiconductor memory device as claimed in claim 6, wherein the first power supply voltage is an array internal power supply voltage, and the second power supply voltage is lower than the first power supply voltage.

11. The semiconductor memory device as claimed in claim 6, wherein the level of a bias current of the local input/output line sense amplifier is adjusted by the second power supply voltage.

12. The semiconductor memory device as claimed in claim 6, wherein the local input/output line precharge unit is adapted to precharge the pair of local input/output lines with the second power supply voltage different from the first power supply voltage only during a period which the column selection signal is in an inactive state operatively blocking the connection between the pair of bit lines and the pair of local input/output lines.

13. A dynamic random access memory, comprising:
   a memory cell array including a plurality of memory cells, each including one access transistor and one storage capacitor, arranged in a matrix;
   a bit line sense amplifier connected to a pair of bit lines connected to the memory cells and adapted to be driven by a first power supply voltage;
   a local input/output line sense amplifier connected between a pair of global input/output lines and a pair of local input/output lines and having a bias current that is adjusted by a second power supply voltage lower than the first power supply voltage;
   a column selecting unit adapted to operatively connect the pair of bit lines and the pair of local input/output lines in response to a column selection signal;
   a local input/output line precharge unit adapted to precharge the pair of local input/output lines with the second power supply voltage during a period for which the column selection signal is in an inactive state;
   a signal generating unit adapted to receive signals related to read/write commands and to generate a period pulse signal for setting a detection operation period;
   a level detecting unit adapted to be enabled in response to the period pulse signal, to compare a reference signal with the second power supply voltage that is fed back, and to output a driving enable signal; and
   a voltage driver adapted to generate the second power supply voltage in response to the driving enable signal and to apply the second power supply voltage to the local input/output line precharge unit and the local input/output line sense amplifier.

14. The dynamic random access memory as claimed in claim 13, wherein the local input/output line precharge unit is adapted to precharge the pair of local input/output lines with the second power supply voltage only during a period which the column selection signal is in an inactive state operatively blocking the connection between the pair of bit lines and the pair of local input/output lines.

* * * * *